United States Patent
Veerasamy et al.

(10) Patent No.: US 9,441,416 B2
(45) Date of Patent: Sep. 13, 2016

(54) LOW TEMPERATURE HERMETIC SEALING VIA LASER

(71) Applicant: Guardian Industries Corp., Auburn Hills, MI (US)

(72) Inventors: Vijayen S. Veerasamy, Ann Arbor, MI (US); Martin D. Bracamonte, Pinehurst, NC (US)

(73) Assignee: Guardian Industries Corp., Auburn Hills, MI (US)

(*) Notice: Subject to any disclaimer, the term of this patent is extended or adjusted under 35 U.S.C. 154(b) by 906 days.

(21) Appl. No.: 13/628,653

(22) Filed: Sep. 27, 2012

(65) Prior Publication Data

US 2014/0087099 A1    Mar. 27, 2014

(51) Int. Cl.
```
E06B 3/677      (2006.01)
E06B 3/66       (2006.01)
E06B 3/673      (2006.01)
C03C 8/24       (2006.01)
C03C 27/08      (2006.01)
C03C 27/10      (2006.01)
E06B 3/663      (2006.01)
E06B 3/667      (2006.01)
```
(52) U.S. Cl.
CPC .............. *E06B 3/6775* (2013.01); *C03C 8/24* (2013.01); *C03C 27/08* (2013.01); *C03C 27/10* (2013.01); *E06B 3/66* (2013.01); *E06B 3/673* (2013.01); *E06B 3/667* (2013.01); *E06B 3/6612* (2013.01); *E06B 3/66333* (2013.01); *E06B 3/66342* (2013.01); *E06B 3/66352* (2013.01); *H01L 2224/83896* (2013.01); *H01L 2924/12044* (2013.01); *H01L 2924/1461* (2013.01)

(58) Field of Classification Search
CPC .... E06B 3/66; E06B 3/6612; E06B 3/66333; E06B 3/66342; E06B 3/66352; E06B 3/667
See application file for complete search history.

(56) References Cited

U.S. PATENT DOCUMENTS

| | | | |
|---|---|---|---|
| 5,657,607 | A | 8/1997 | Collins et al. |
| 5,664,395 | A | 9/1997 | Collins et al. |
| 5,902,652 | A | 5/1999 | Collins et al. |
| 6,383,580 | B1 | 5/2002 | Aggas |

(Continued)

FOREIGN PATENT DOCUMENTS

| | | |
|---|---|---|
| CN | 1327262 A | 12/2001 |
| EP | 2 351 717 | 8/2011 |

(Continued)

OTHER PUBLICATIONS

"Glass-to-Glass Electrostatic Bonding with Intermediate Amorphous Silicon Film for Vacuum Packaging of Microelectronics and its Application", Lee et al., Sensors and Actuators A 89 (2001); pp. 43-48.

*Primary Examiner* — Donald J Loney
(74) *Attorney, Agent, or Firm* — Nixon & Vanderhye P.C.

(57) ABSTRACT

A method and apparatus for low temperature laser sealing of bonded articles is disclosed. Hermetic sealing of glass substrates using low temperature sealing techniques that do not adversely affect bulk strength of glass substrates, the environment created between the substrates and/or any components housed within the sealed glass substrates is disclosed. Such low temperature sealing techniques include use of localized laser heating of sealing materials to form a hermetic seal between glass substrates that does not involve heating the entire article to be sealed.

9 Claims, 7 Drawing Sheets

(56) References Cited

U.S. PATENT DOCUMENTS

| | | |
|---|---|---|
| 6,506,472 B1 | 1/2003 | Tanaka et al. |
| 6,641,689 B1* | 11/2003 | Aggas ............... C03B 27/00 156/109 |
| 6,692,600 B2 | 2/2004 | Veerasamy et al. |
| 6,998,776 B2* | 2/2006 | Aitken ............... C03C 3/072 313/512 |
| 8,137,494 B2 | 3/2012 | Cooper et al. |
| 8,857,698 B2 | 10/2014 | Bouesnard et al. |
| 2008/0166570 A1 | 7/2008 | Cooper |
| 2011/0262726 A1* | 10/2011 | Knoll ............... C03C 17/36 428/213 |

FOREIGN PATENT DOCUMENTS

| | | |
|---|---|---|
| WO | WO 2008/103338 | 8/2008 |
| WO | WO 2012/170566 | 12/2012 |

* cited by examiner

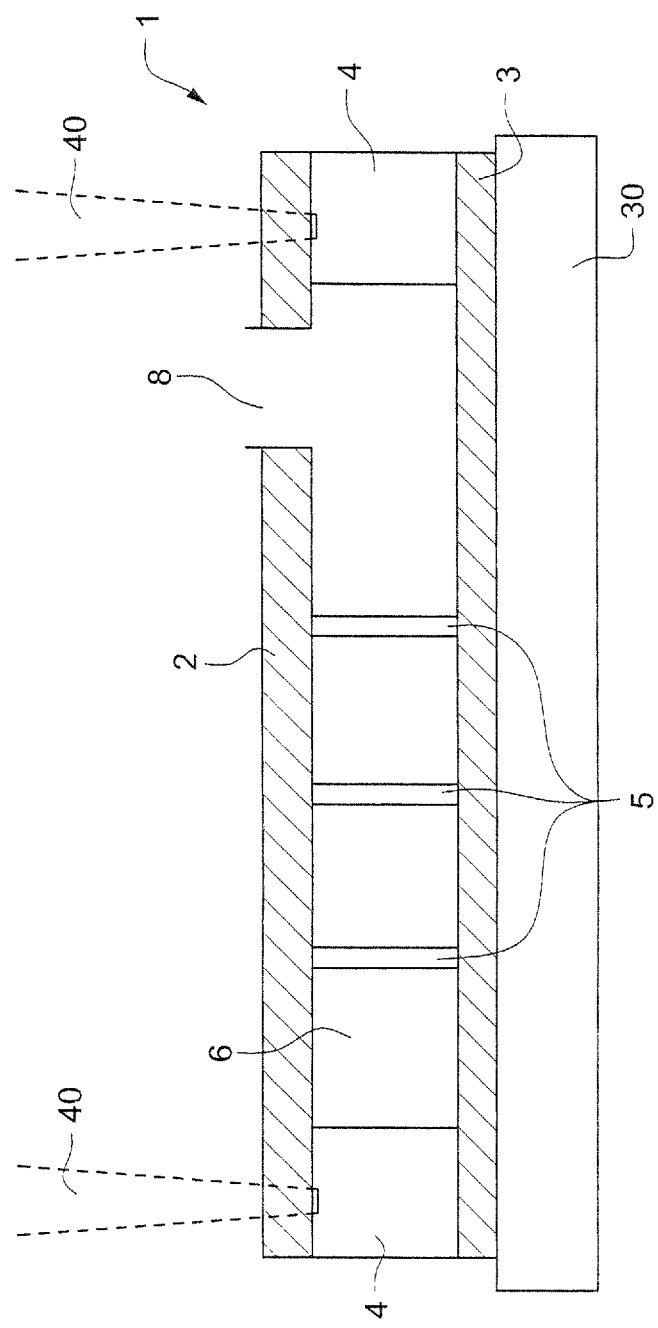

LOW TEMPERATURE HERMETIC SEALING VIA LASER

TECHNICAL FIELD

The disclosure relates generally to hermetic sealing of substrates that form packages that hold a vacuum, such as, for example, vacuum insulated glass (VIG) window units, or that house sensitive components in an inert atmosphere, such as, for example, sensitive materials including, but not limited to, organic light emitting layers, semiconductor chips, sensors, optical components, or the like. The disclosure more particularly relates to hermetic sealing of substrates (e.g., glass substrates) using low temperature sealing techniques that do not adversely affect the substrates, the environment created between the substrates and/or any components housed within the sealed substrates. Such low temperature sealing techniques include use of localized laser heating of sealing material(s) to form a hermetic seal between glass substrates that does not involve heating the entire article to be sealed. The low temperature techniques disclosed herein may also be referred to as sealing under non-thermal equilibrium conditions.

BACKGROUND AND SUMMARY OF EXAMPLE EMBODIMENTS

Hermetic sealing of glass substrates to create a vacuum or inert gas environment therebetween is typically made possible using barriers of usually glassy or metallic (e.g., eutectic) materials that are impermeable to ingress of gasses over a long time period, typically many orders of magnitude longer than the device operating lifetime. As will be understood, permeability involves two steps. These steps include dissolution and diffusion. Heremetic sealing keeps, for example, water, other liquids, oxygen and other gaseous contaminant molecules out of packages that hold, for example, and without limitation, a vacuum (e.g., VIG window units, thermos flask, MEMS, and the like), or sensitive materials, such as, for example, and without limitation, organic emitting layers (e.g., used in OLED devices), semiconductor chips, sensors, optical components, or the like, held in an inert atmosphere. Gas tight packaging of the complex interiors of such assemblies has posed obstacles in the later stages of processing of such packages, such as, for example prior to pumping and tip fusing in the case of VIG window units, or last processing steps in the manufacture of OLED devices.

Some example VIG configurations are disclosed, for example, in U.S. Pat. Nos. 5,657,607, 5,664,395, 5,657,607, 5,902,652, 6,506,472 and 6,383,580, the disclosures of which are all hereby incorporated by reference herein in their entireties.

FIGS. 1 and 2 illustrate a typical VIG window unit 1 and elements that form the VIG window unit 1. For example, VIG unit 1 may include two spaced apart substantially parallel glass substrates 2, 3, which enclose an evacuated low-pressure space/cavity 6 therebetween. Glass sheets or substrates 2,3 are interconnected by a peripheral edge seal 4 which may be made of fused solder glass or the like, for example. An array of support pillars/spacers 5 may be included between the glass substrates 2, 3 to maintain the spacing of substrates 2, 3 of the VIG unit 1 in view of the low-pressure space/gap 6 present between the substrates 2, 3.

A pump-out tube 8 may be hermetically sealed by, for example, solder glass 9 or the like to an aperture/hole 10 that passes from an interior surface of one of the glass substrates 2 to the bottom of an optional recess 11 in the exterior surface of the glass substrate 2, or optionally to the exterior surface of the glass substrate 2. A vacuum is attached to pump-out tube 8 to evacuate the interior cavity 6 to a low pressure that is less than atmospheric pressure, for example, using a sequential pump down operation. After evacuation of the cavity 6, a portion (e.g., the tip) of the tube 8 is melted to seal the vacuum in low pressure cavity/space 6. The optional recess 11 may retain the sealed pump-out tube 8. Optionally, a chemical getter 12 may be included within a recess 13 that is disposed in an interior face of one of the glass substrates, e.g., glass substrate 2. The chemical getter 12 may be used to absorb or bind with certain residual impurities that may remain after the cavity 6 is evacuated and sealed.

VIG units with peripheral hermetic edge seals 4 (e.g., solder glass) are typically manufactured by depositing glass frit or other suitable material in a solution (e.g., frit paste) around the periphery of substrate 2 (or on substrate 3). This glass frit paste ultimately forms the edge seal 4. The other substrate (e.g., 3) is brought down on substrate 2 so as to sandwich spacers/pillars 5 and the glass frit solution between the two substrates 2, 3. The entire assembly including the glass substrates 2, 3, the spacers/pillars 5 and the seal material (e.g., glass frit in solution or paste), is then typically heated to a temperature of at least about 500° C., at which point the glass frit melts, wets the surfaces of the glass substrates 2, 3, and ultimately forms a hermetic peripheral/edge seal 4.

After formation of the edge seal 4 between the substrates, a vacuum is drawn via the pump-out tube 8 to form low pressure space/cavity 6 between the substrates 2, 3. The pressure in space 6 may be produced by way of an evacuation process to a level below atmospheric pressure, e.g., below about $10^{-2}$ Torr. To maintain the low pressure in the space/cavity 6, substrates 2, 3 are hermetically sealed via the edge seal and sealing off of the pump-out tube. Small high strength spacers/pillars 5 are provided between the transparent glass substrates to maintain separation of the approximately parallel glass substrates against atmospheric pressure. As noted above, once the space 6 between substrates 2, 3 is evacuated, the pump-out tube 8 may be sealed, for example, by melting its tip using a laser or the like.

High-temperature bonding techniques such as, for example, anodic bonding and glass frit bonding, as discussed above, have been widely used method for hermetically sealing (e.g., forming an edge seal) components made of silicon, ceramics, glass, or the like. The heat required for these high-temperature processes is typically in the range of about 300° C. to 600° C. These conventional bonding techniques typically require oven-intensive bulk heating in which the entire device (including the glass and any components housed within the glass housing) comes to near thermal equilibrium with the oven for a seal to form. As a result, a relatively long period of time is required to achieve an acceptable seal. For example, as the device size L increases, the sealing time may typically increase on the order of $L^3$. It is also the case that the most temperature sensitive component determines the maximum allowable temperature of the entire system. Thus, high-temperature sealing processes discussed above (e.g., anodic bonding and glass frit bonding) are not suitable for fabricating heat-sensitive components such as, for example, tempered VIG units and encapsulating sensitive components, such as, for example, OLED devices. In the case of tempered VIG units, the thermally tempered glass substrates of a VIG unit would rapidly lose temper strength in the high-temperature environment. In the case of an example OLED package, certain functional organic layers would be destroyed at temperatures of 3000-600 degrees C. (sometimes even as low as 100° C.). In the past, one way to address this with high-temperature bulk sealing processes was to develop lower temperature frits, while still using bulk thermal equilibrium heating processes.

By way of background, glass frits and/or solders are typically mixtures of glass material and metallic oxides. Glass composition may be tailored to match the coefficient of thermal expansion (CTE) of the bonding substrates. Lead-based glasses are the most common bonding/sealing material/technique used commercially in cathode ray tubes (CRT), plasma displays and VIG window units. Lead-based glass frits are also among the least permeable glass sealing materials. Traditionally, these solders are based on glassy materials and de-vitrification is suppressed.

Glass frits or solders are typically made up of a base glass, a refractory filler and a vehicle. The base glass forms the bulk of the frit or solder. The filler reduces the CTE as well as matching it to the glass substrates to be joined. This matching enhances the mechanical strength, reduces interfacial stress and improves the crack resistance of the seal. The vehicle is typically made of a solvent that provides fluidity for screen printing and an organic binder.

Among the advantages of these types of glass frits or solders is that they include a relatively low melting point (e.g., in a range of about 480° C.-520° C.) glass that will stick to most semiconductor materials, including, but not limited to, glass, silicon, silicon oxide, most metals and ceramics, making bonding techniques using these types of materials versatile and widely accepted.

There are many different types of commercially available glass fit materials having various melting points, CTEs, organing binders and screen printing properties. However, almost all lower melting point formulations of glass fit or solder contain some lead. This may potentially become a major drawback, as the EU and Japan are severely limiting, if not forbidding, the use of lead in electronics manufacturing in the coming years. In the last few years, frits or solders based on bismuth oxides have had some success in replacing lead based frits, however the melting temperature (Tg) of these types of frits is still typically above about 450° C. As with lead based fits, these bismuth oxide based frits cannot be used for fabrication of temperature sensitive devices using conventional oven bulk heating processes. Lower Tg (e.g., 375° C.-390° C.) fits based on vanadium barium zinc oxides (VBZ) have also been developed, including, but not limited to, VBaZn, V phosphates, $SnZnPO_4$. However, widespread usage of these types of frits has heretofore been limited.

Therefore, there exists a need for a seal processing technique that does not involve heating the entire article to be sealed to high temperature(s). In other words, a technique that utilizes localized heating substantially limited to an area in which the material used to form the seal, for example, frit-inclusive seal material, is disposed is needed. Such a localized approach may be achieved, for example, and without limitation, via controlled laser heating of the seal material and resulting vitrified solder bead. In such a technique, the localized heating may be limited to the frit, or an area proximate where the frit is deposited, and the heating profile may be kept moderate. It may also be advantageous to include a system for localized heat sinking to control lateral heat flow to reduce cracking due to stress and the relatively large differences in expansion characteristics and temperature gradients. The molten seam or bead formed using this type of localized process is used to join the desired parts, e.g., the glass substrates of a VIG unit. This process may be referred to as laser stitching since the molten seam or bead in effect stitches the joining parts together. According to certain alternative example embodiments, such localized controlled laser heating may also be used with eutectic sealing materials.

In conventional oven bulk heating processes, a frit paste is typically applied to a glass substrate and, in a process referred to as drying, is heated at a relatively low temperature (e.g., in a range of about 120° C.-150° C.) to remove the solvent from the vehicle. Next, the glass is heated to a higher temperature in a glazing process to glaze the frit and drive out the organic binder material. In a subsequent vitrification process frit is then vitrified by raising its temperature to its melting point to form a continuous film comprising the glass network. Finally, the glass substrates are aligned and heated above the glass melting temperature while the substrates are squeezed together to form the final hermetic seal between the substrates.

According to an example, non-limiting embodiment, after the frit paste is applied, dried and glazed, localized vitrification (e.g., instead of bulk oven processing) is performed using a laser in air or an inert atmosphere. During this process, it may be preferable to include localized heat sinking to control lateral heat flow. A roller mechanism or application of a vacuum pump-down may optionally be used to apply force between the substrates being joined together. The substrates are aligned and the frit sealing material is brought to temperature(s) above its melting temperature by localized laser irradiation to perform laser induced bonding of the frit and/or solder to the glass substrate(s). In a subsequent step, laser annealing of the solder may also be performed to reduce the stress between the seal and the substrate(s). It has also been found that roughening of the glass prior to the application of the frit sealing material provides improved bonding strength of the frit to glass interface.

According to another example, non-limiting embodiment, the localized heating approach may be achieved via controlled laser heating of the vitrified solder bead and/or seam. The amount of power delivered to the frit may be controlled by a feedback loop using the temperature at some distance from the thermal spike as input to a feedback loop. Monitoring and controlling the high process temperatures in the joining area via feedback control of the laser power and duration provides advantages in managing the stress and breakage of the device.

According to certain alternative example embodiments, a eutectic sealing material (e.g., metallic or metal alloy solder) may be used instead of glass based or glass inclusive frit sealing materials. In such alternative example embodiments, because metal cannot typically be used directly on glass, an absorber layer may be interposed between the eutectic seal material and the glass substrate(s). The absorber film/layer may, for example, and without limitation, include a first layer of or including silicon nitride and a second layer of or including a metal such as electrodeless Ni (or a metal alloy). In such example embodiments, the energy of the laser beam is transmitted through a glass substrate and absorbed by the absorber film. As a result, for example, the Si and/or metal of the absorber locally heats up, melts the eutectic material, and the Si is bonded to the glass substrate(s). As noted above, control of the laser may be achieved using a feedback loop in which the high process temperatures in the joining area are monitored and fed back to control the laser power and duration.

In certain example embodiments of this invention, there is provided a method of making a vacuum insulated glass (VIG) window unit, the method comprising: providing a first substrate; applying a seal material to an area of the first substrate to be sealed; forming a seal by at least (a) vitrifying the seal material using laser irradiation, the laser irradiation exposing the seal material but not being directed toward a majority of the first substrate, and (b) bonding the first substrate to a second substrate by continuing to irradiate the vitrified seal material with laser irradiation to melt the seal material; and evacuating a cavity formed between the first and second substrates and defined by the seal to a pressure lower than atmospheric pressure.

In certain example embodiments, there is provided a method of making a bonded article having a cavity formed between two glass substrates, comprising: providing first and second glass substrates; applying a sealing material to one of the glass substrates; and forming a seal by irradiating the sealing material with a laser, wherein said cavity is defined by geometries of the glass substrates and the seal, wherein the cavity is either reduced to a pressure below atmospheric pressure or provided with an inert gas atmosphere and may have disposed therein temperature sensitive components.

In certain embodiments of this invention, there is provided a vacuum insulated glass (VIG) window unit, comprising: first and second substantially parallel spaced apart substrates comprising glass that are bonded together by an edge seal, said first and second substrates and said edge seal defining a cavity having a pressure lower than atmospheric pressure; and wherein said edge seal comprises (i) a metallic or substantially metallic layer; and (ii) an absorber film. The edge seal may be formed via at least laser irradiation.

These and other embodiments and advantages are described herein with respect to certain example embodiments and with reference to the following drawings in which like reference numerals refer to like elements, and wherein:

BRIEF DESCRIPTION OF THE DRAWINGS

FIG. 3 is a schematic partial cross sectional diagram illustrating a VIG unit and seal material being irradiated by a laser according to an example embodiment;

DETAILED DESCRIPTION OF EXAMPLE EMBODIMENTS

Figure 2:
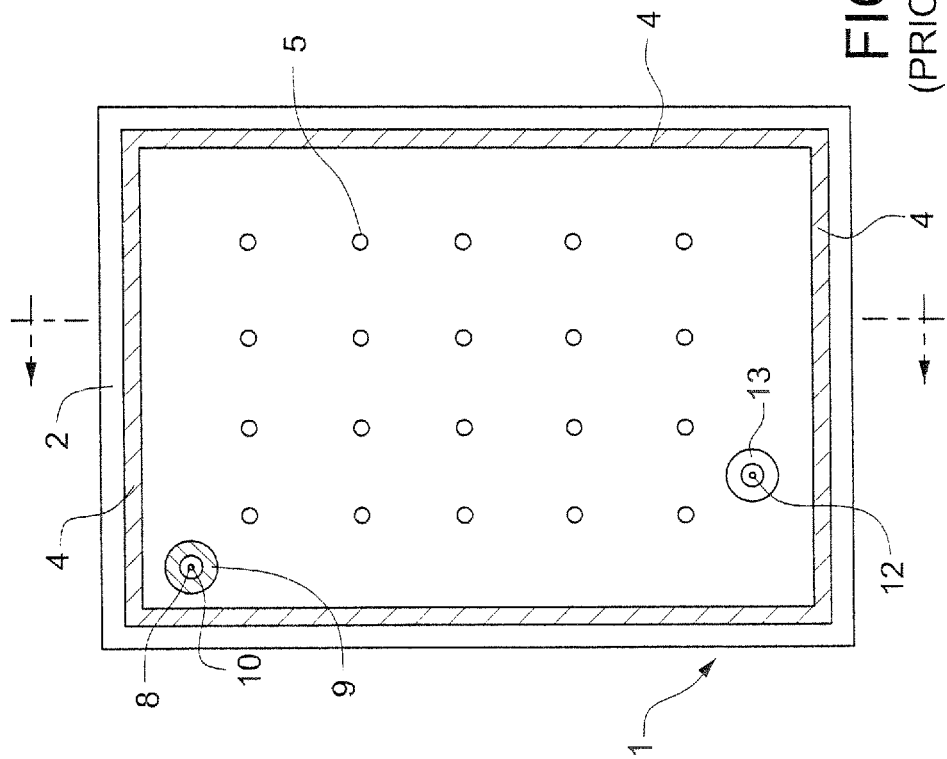
FIG. 2 is a top plan view of a conventional VIG unit.
Figure 1:
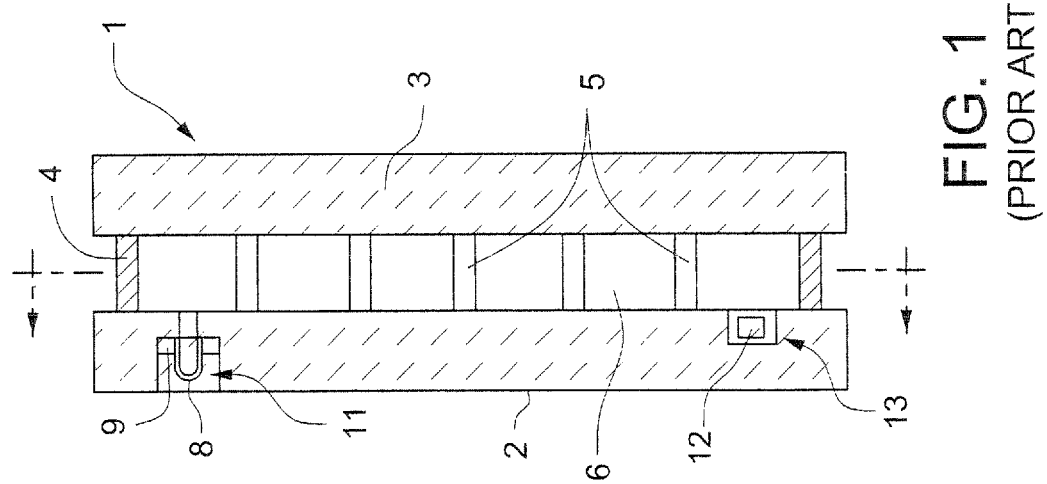
FIG. 1 is a cross sectional schematic diagram of a conventional VIG unit.

Certain example embodiments will be described in detail herein with reference to the foregoing drawings in which like reference numerals refer to like elements. It will be understood that the embodiments described herein are intended to be illustrative, not limiting, and that those skilled in the art will understand that various modifications may be made without departing from the true spirit and full scope of the claims appended hereto.

With reference to FIG. 3, a schematic partial cross sectional diagram illustrating a VIG unit and seal material being irradiated by a laser according to an example embodiment is provided. The VIG unit 1 may include two spaced apart substantially parallel glass substrates 2, 3, which enclose an evacuated low-pressure space/cavity 6 therebetween. Glass sheets or substrates 2,3 are interconnected by a peripheral edge seal 4 which may be made of fused solder glass or the like, for example, that may be formed using a laser 40 as described below with reference to certain example embodiments. An array of support pillars/spacers 5 may be included between the glass substrates 2, 3 to maintain the spacing of substrates 2, 3 of the VIG unit 1 in view of the low-pressure space/gap 6 present between the substrates 2, 3. A vacuum is drawn via the pump-out tube 8 to form low pressure space/cavity 6 between the substrates 2, 3. The pressure in space 6 may be produced by way of an evacuation process to a level below atmospheric pressure, e.g., below about $10^{-2}$ Torr. To maintain the low pressure in the space/cavity 6, substrates 2, 3 are hermetically sealed via the edge seal 4 and sealing off of the pump-out tube 8. As noted above, small high strength spacers/pillars 5 are provided between the transparent glass substrates to maintain separation of the approximately parallel glass substrates against atmospheric pressure. As noted above, once the space 6 between substrates 2, 3 is evacuated, the pump-out tube 8 may be sealed, for example, by melting its tip using a laser or the like.

According to certain example embodiments, the edge seal 4 is formed by controlled localized heating via a laser 40, as will be described in greater detail herein. Because of the large temperature gradient between the molten glass frit and the much cooler, for example, room temperature, glass substrates 2, 3, it may be preferable to include a localized heat sink 30, comprising a material having good thermal conductivity, such as, for example, and without limitation, copper, or the like and having good thermal contact with the substrate 3. Additionally, control of laser power in continuous or pulse mode may be accomplished using a feedback loop that informs a laser power control unit of temperatures in the vicinity of the molten seam or bead, thereby enabling control of the power and duration of laser heating. It will be understood that a pulsed or continuous application of laser energy may be used according to certain example embodiments. An example feedback control arrangement is discussed below with reference to FIG. 7, and is advantageous in controlling and managing stress and breakage of the device that might otherwise occur. The laser heat processing technique described herein does not involve heating of the entire article to be hermetically sealed, and instead uses a localized approach achieved by controlled laser heating of the vitrified solder bead to achieve low temperature or non-thermal equilibrium sealing.

In particular, laser based sealing using glass based solder materials according to certain example embodiments subjects primarily the solder to heat and subjects the remainder of the component being sealed to relatively minimal thermal loading. It is noted that the laser based sealing techniques disclosed herein work equally well with both low (e.g., VBZ type frits) and high Tg frit materials. Non-limiting examples of suitable low Tg frits include, but are not limited to, solders based on V, Ba, Zn, POx, VPOx, or the like. Another advantage of the laser based sealing techniques disclosed herein is that the solder is readily processable in air at ambient temperatures and pressures. The frit matrix that is used to form the edge seal 4 preferably includes an absorber dye that can be tuned to the wavelength of the laser being used. In this manner, the glass of the substrates 2, 3 allows the laser energy to pass through without significant absorption, leaving the substrate glass relatively unheated, while at the same time, the laser energy is absorbed by the frit material, thereby selectively heating the frit material to vitrify the frit and bond the substrates with a hermetic glass seal. It may also be preferable to incorporate two beams that raster about opposite edges of the substrates in opposite directions to improve speed and throughput, and to ensure more complete frit vitrification and bonding. It will be understood that a single beam raster of the substrate edge seal materials may also be used to seal the substrates. According to certain embodiments, when sealing substrates of a VIG window unit, active pumping via a roughing pump, or the like, may be used to allow the substrates to be kept or held in place during sealing, thereby obviating the need for using clamps. In the case of sealing a housing in which other components may be disposed, a roller may also be used. Subsequent rasters of laser energy may be applied to the bonded frit area after seal formation to anneal the seal to thereby reduce stress and later failures caused by such stress, including, for example, cracking of the seal. It will be further understood that the application of laser energy according to the various embodiments disclosed herein may be performed in a pulsed or continuous manner. According to certain example embodiments, roughening of the glass prior to the application of the frit sealing material provides improved bonding strength of the frit to glass interface.

Because of the high temperature gradients experienced when using the disclosed laser based sealing techniques, it may be preferable to include a localized heat sink to reduce the lateral flow of heat, for example, and without limitation, across the glass substrate(s), or to the sensitive device area in embodiments in which sensitive electronic components are sealed in a housing. According to certain embodiments, a localized heat sink comprising materials having good thermal conductivity properties, such as, for example, and without limitation, copper, may be placed on an underside of the package (e.g., on the opposite side of the laser application) in a vicinity of the center of the underside of the package, and with good thermal contact between the package and the heat sink.

Figure 5:
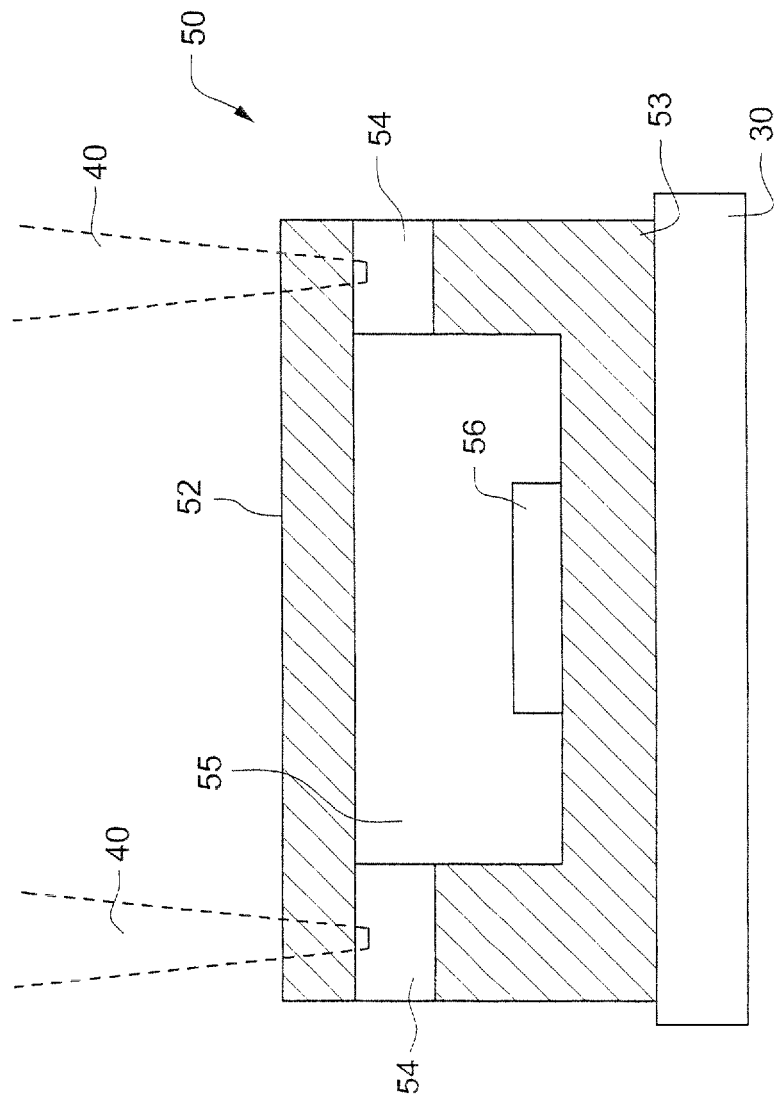
FIG. 5 is a schematic partial cross sectional diagram illustrating an electronic component package and seal material being irradiated by a laser according to an example embodiment.

FIG. 5 is a schematic partial cross sectional diagram illustrating an electronic component package and seal material being irradiated by a laser according to an example embodiment. The component package 50 may include two spaced apart glass substrates 52, 53, which enclose an evacuated low-pressure or inert gas environment space/cavity 55 therebetween. An electronic or optical component 56, such as, for example, and without limitation, a semiconductor device, organic light emitting device (OLED), electronic circuits, semiconductor chips, sensors, optical components, or the like, may be housed in a cavity 55 formed between the glass substrates 52, 53. Glass substrates 52, 53 are interconnected by a peripheral edge seal 54 which may be made of fused solder glass or the like, for example, that may be formed using a laser as described below with reference to certain example embodiments. The pressure in space 55 may be produced by way of an evacuation process to a level below atmospheric pressure, e.g., below about $10^{-2}$ Torr. To maintain the low pressure in the space/cavity 55, substrates 52, 53 are hermetically sealed via the edge seal 4. The cavity 55 may also be provided with an inert gaseous atmosphere in which the component 56 may be disposed.

According to certain example embodiments, the edge seal 4 is formed, along the lines described above with reference to FIG. 3, by controlled localized heating via a laser 40, as will be described in greater detail herein. Because of the large temperature gradient between the molten glass fit and the much cooler, for example, room temperature, glass substrates 52, 53, it may be preferable to include a localized heat sink 30, comprising a material having good thermal conductivity, such as, for example, and without limitation, copper, or the like. Additionally, control of laser power in continuous or pulse mode may be accomplished using a feedback loop that informs a laser power control unit of temperatures in the vicinity of the molten seam or bead, thereby enabling control of the power and duration of laser heating. It will be understood that a pulsed or continuous application of laser energy may be used according to certain example embodiments. An example feedback control arrangement is discussed below with reference to FIG. 7, and is advantageous in controlling and managing stress and breakage of the device that might otherwise occur. The laser heat processing technique described herein does not involve heating of the entire article to be hermetically sealed, and instead uses a localized approach achieved by controlled laser heating of the vitrified solder bead to achieve low temperature or non-thermal equilibrium sealing.

In particular, laser based sealing using glass based solder materials according to certain example embodiments subjects primarily the solder to heat and subjects the remainder of the component being sealed to relatively minimal thermal loading. It is noted that the laser based sealing techniques disclosed herein work equally well with both low (e.g., VBZ type frits) and high Tg frit materials. Non-limiting examples of suitable low Tg frits include, but are not limited to, solders based on V, Ba, Zn, POx, VPOx, or the like. Another advantage of the laser based sealing techniques disclosed herein is that the solder is readily processable in air at ambient temperatures and pressures. The frit matrix that is used to form the edge seal 4 preferably includes an absorber dye that can be tuned to the wavelength of the laser being used. In this manner, the glass of the substrates 52, 53 allows the laser energy to pass through without significant absorption, leaving the substrate glass relatively unheated, while at the same time, the laser energy is absorbed by the frit material, thereby selectively heating the frit material to vitrify the frit and bond the substrates with a hermetic glass seal. It is also preferable to incorporate two beams that raster about opposite edges of the substrates in opposite directions to improve speed and throughput, and to ensure more complete frit vitrification and bonding. It will be understood that a single beam raster of the substrate edge seal materials may also be used to seal the substrates. According to certain embodiments, when sealing substrates, active pumping via a roughing pump, or the like, may be used to allow the substrates to be kept or held in place during sealing. Alternatively, a roller may also be used. Subsequent rasters of laser energy may be applied to the bonded frit area after seal formation to anneal the seal to thereby reduce stress and later failures caused by such stress, including, for example, cracking of the seal. It will be further understood that the application of laser energy according to the various embodiments disclosed herein may be performed in a pulsed or continuous manner.

Because of the high temperature gradients experienced when using the disclosed laser based sealing techniques, it may be preferable, as noted above, to include a localized heat sink 30 to reduce the lateral flow of heat, for example, and without limitation, across the glass substrate(s), or to the sensitive device area in embodiments in which sensitive electronic components are sealed in a housing. According to certain embodiments, a localized heat sink comprising materials having good thermal conductivity properties, such as, for example, and without limitation, copper, may be placed on an underside of the package (e.g., on the opposite side of the laser application) in a vicinity of the center of the underside of the package, and with good thermal contact between the package and the heat sink.

According to certain alternative example, non-limiting embodiments, a eutectic seal material may be used to seal the glass substrates in place of a glass based frit material. Metallic based (or eutectic) solders have an even lower melting point that glass based seal materials. However, eutectics typically may not be used directly onto glass substrates because of the presence of oxygen ions. In addition, when heated, the metal solder is oxidized and beads up giving rise to puddles and micro-bubbles. To avoid these problems that are sometimes attendant with using eutectic solders to seal glass substrates, according to certain example embodiments, an absorber or absorption film may be introduced between the glass substrate and the eutectic material. According to this alternative embodiment, the laser energy is transmitted through the highly transparent glass substrate 52 and is absorbed by an absorber film, such as, for example, and without limitation, a silicon rich SiNx/Ni or SiNx/Cr double layer film. As a result, the silicon heats up locally and melts the eutectic material thereby forming a eutectic seal bonding the glass substrates. Optionally, as noted above, a small force may be applied during processing to ensure that the materials stay in contact during laser processing. Using this bonding technique with an interlayer of SiNx/Ni or SiNx/Cr to glass joining the silicon and glass are locally fused together in the process while the surrounding glass material remains at room temperatures. According to certain example, non-limiting embodiments, a metal oxide layer may be pre-deposited onto the glass substrates prior to frit (e.g., seal material) deposition to wet the glass substrates and fill gaps, for example, by capillary action. As discussed above, pulsed single shots or continuous application of laser energy may be used. Forming eutectic hermetic seals requires that one material (e.g., the substrate material) be highly transmissive while the other material, e.g., the absorber material, be strongly absorbing at the wavelength of the selected laser beam.

Figure 4:
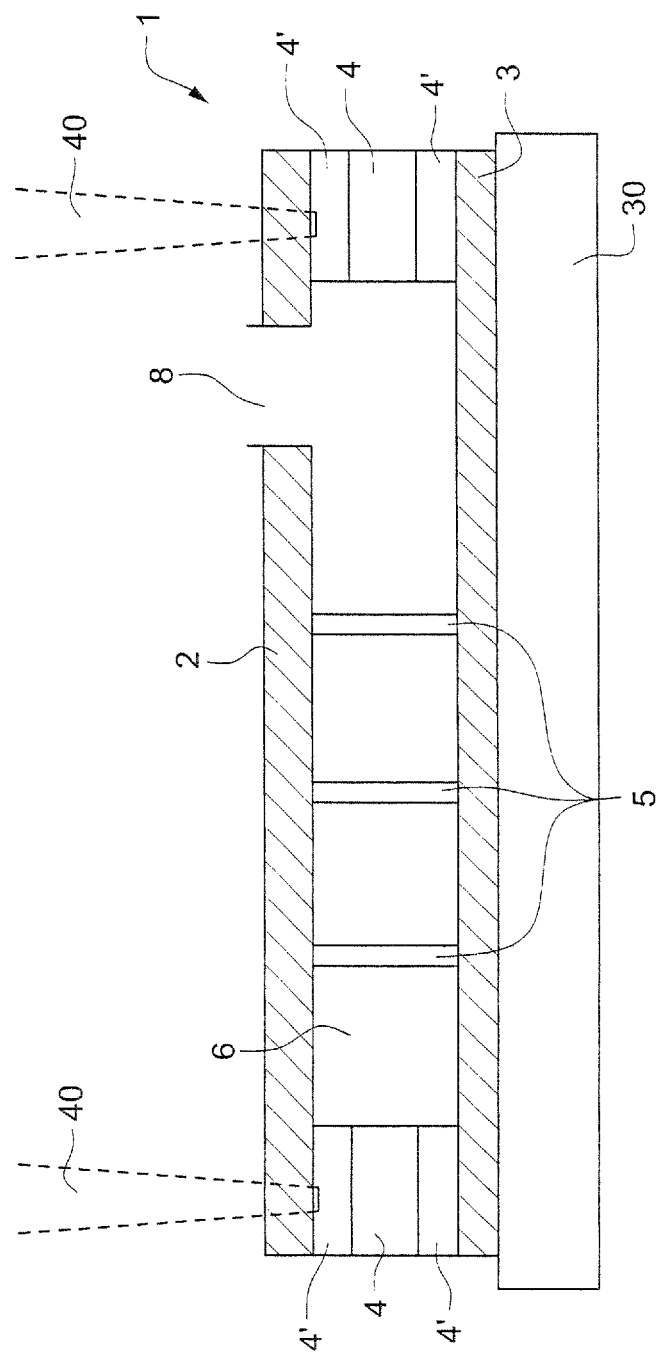
FIG. 4 is a schematic partial cross sectional diagram illustrating a VIG unit and seal material including an absorber film and eutectic seal material being irradiated by a laser according to another example embodiment.
Figure 6:
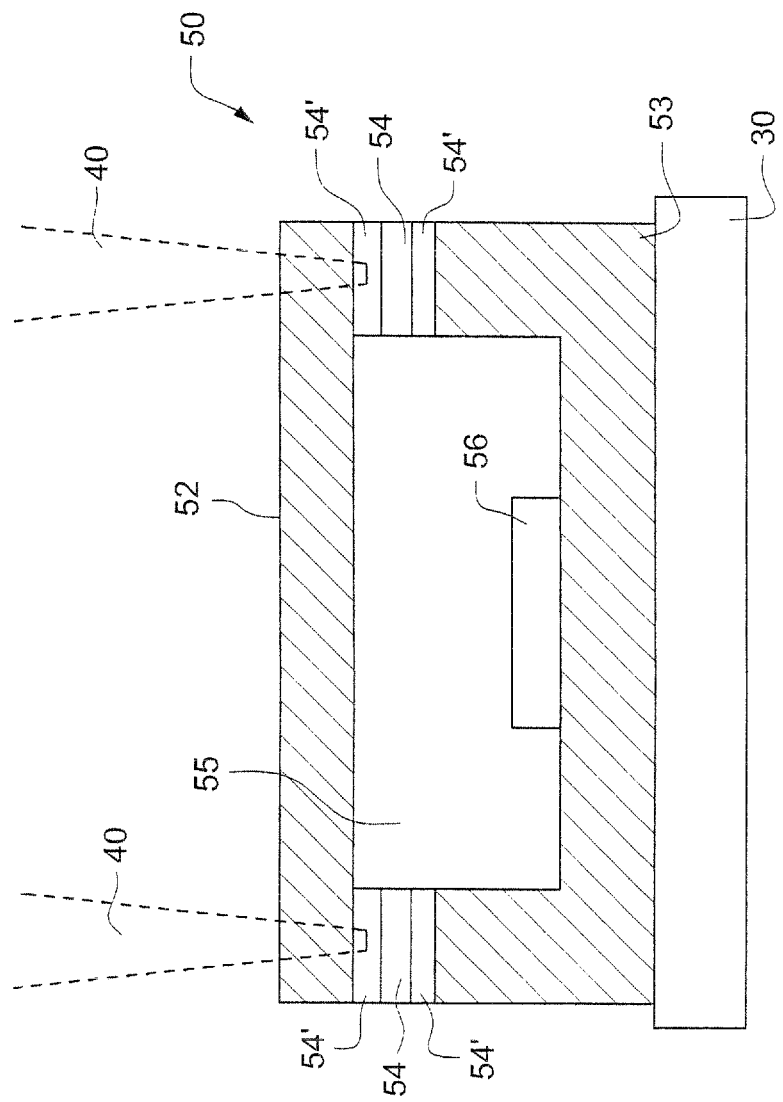
FIG. 6 is a schematic partial cross sectional diagram illustrating an electronic component package and seal material including an absorber film and eutectic seal material being irradiated by a laser according to another example embodiment.

FIGS. 4 and 6, are similar to the embodiments illustrated in FIGS. 3 and 5, but include a eutectic solder material 4, 54, respectively, together with an absorber film 4', 54', respectively, as described and discussed in detail above. Moreover, it will be understood that the absorber film 4', 54' may be disposed on one or both glass substrates 2, 3, 52, 53. As discussed above, according to this alternative example embodiment, because metal cannot typically be used directly on glass, an absorber layer 4', 54' may be interposed between the eutectic seal material 4, 54 and the glass substrate(s) 2, 3, 52, 53. The absorber film/layer 4', 54' may, for example, and without limitation, include a first layer of or including silicon nitride and a second layer of or including a metal such as electrodeless Ni (or a metal alloy). The absorber film 4', 54', according to certain example non-limiting embodiments, may comprise a dual layer of silicon rich SiNx/Ni or SiNx/Cr In such example embodiments, the energy of the laser beam 40 is transmitted through a glass substrate 2, 3, 52, 53 and absorbed by the absorber film 4', 54'. As a result, for example, the Si and/or metal of the absorber locally heats up, melts the eutectic material, and the Si is bonded to the glass substrate(s). As noted above, control of the laser may be achieved using a feedback loop in which the high process temperatures in the joining area are monitored and fed back to control the laser power and duration, as illustrated and described herein with reference to FIG. 7.

Among the example advantages achieved using the laser techniques disclosed herein are that the laser technique is a substantially non-contact technique, hence there is no wear and tear or contamination of the substrates being bonded. Additionally, due to the controlled application of the laser beam, processing time, temperature and volume being heated can be controlled very precisely, thus even complex designs (especially in the case of component packaging) may be realized. Further, when using a laser as the heat source, the heat input to the device can be highly localized since the laser beam can be focused to a small spot. Moreover, in the VIG embodiments disclosed herein, the laser may optionally be applied to the bead from the side instead of through the glass substrate.

Figure 7:
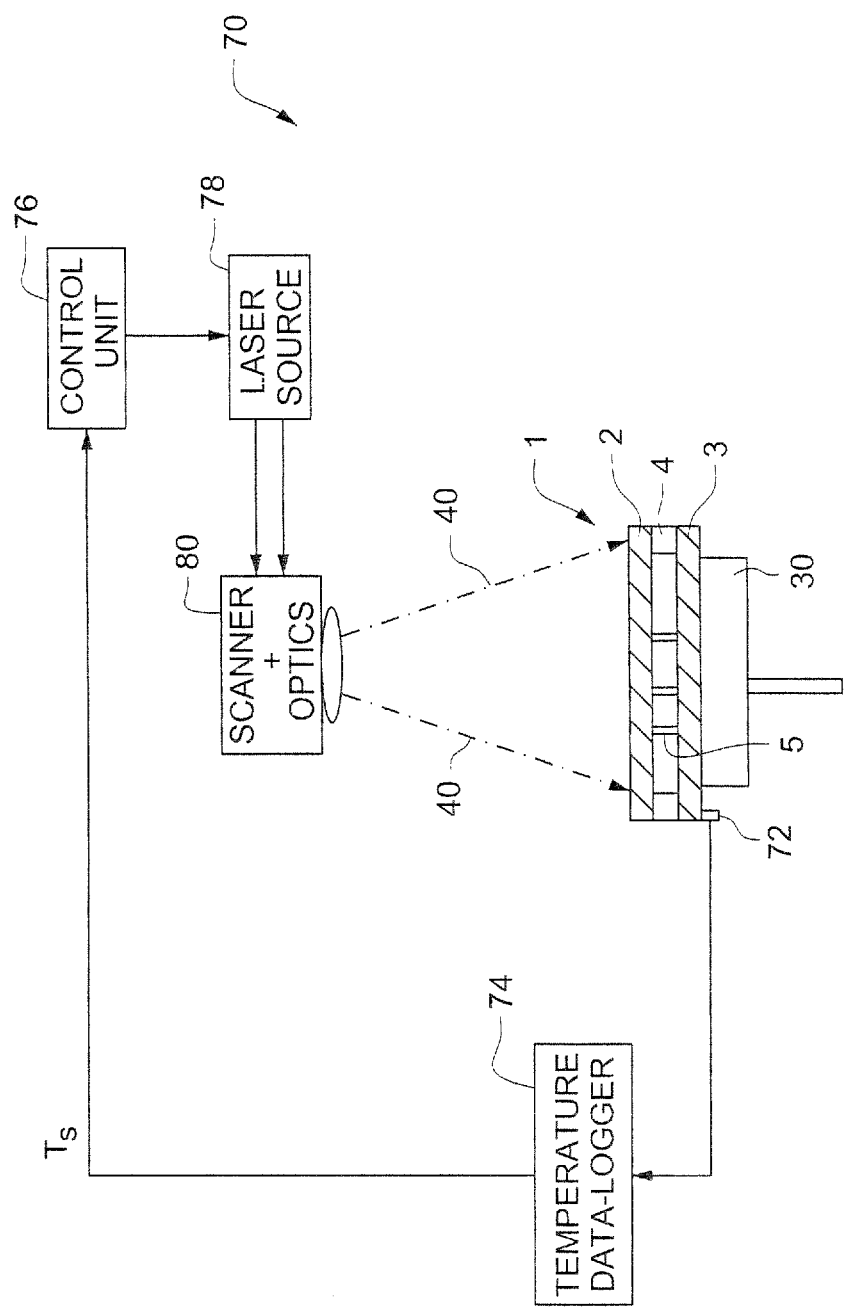
FIG. 7 is a schematic block diagram illustrating a laser irradiation system including feedback control according to certain example embodiments.

FIG. 7 is a schematic block diagram illustrating an example laser irradiation system including feedback control according to certain example embodiments. The laser system according to this example non-limiting embodiment includes a laser source 78 that provides laser energy of a given power and duration to a scanner and optics subsystem 80. The scanner and optics subsystem 80 provides a beam of a given spot size via the optics to the object being irradiated, such as, for example, a VIG window unit 1. The scanner and optics subsystem 80 may provide a single beam that rasters about a periphery of the VIG window unit 1 in a given direction, or optionally may provide two beams 40 that are applied to opposite sides of the VIG unit 1 and raster in opposite directions. According to certain example embodiments, the laser beams 40 may be arranged to irradiate opposite sides (e.g., top and bottom) of the VIG window unit 1. According to still further example embodiments, a SWIR heater may be used in conjunction with the application of laser beam(s) 40. The laser beams 40 may be held and moved by robot arms to provide even greater raster control. A sensor 72, that is preferably remote from the beam monitors the temperature Ts in the vicinity of the bead. The sensor 72 may be any suitable type of sensor that can monitor temperatures, such as, for example, Ts. Such sensors may include, for example, and without limitation, a pyrometer, bolometer, infrared imager, micro-thermocouples, or the like. Ts is the feedback control parameter according to this example. Ts is output by the sensor 72, which may be located close to the article being irradiated, or may optionally be disposed with the scanner and optics subsystem, the laser head, or the like, for example. Ts from the sensor 72 is provided to a temperature data logger 74, which receives and records the Ts as it is being monitored. Ts is fed to the control unit 76, which provides control signals to the laser source 78 to control various parameters of the laser, including, but not limited to, power and duration. In embodiments that use a SWIR heater, the SWIR heater may be included in the feedback loop to provide additional feedback control. As noted above, the laser source 78 may emit laser energy in a pulsed and/or continuous manner.

Figure 8:
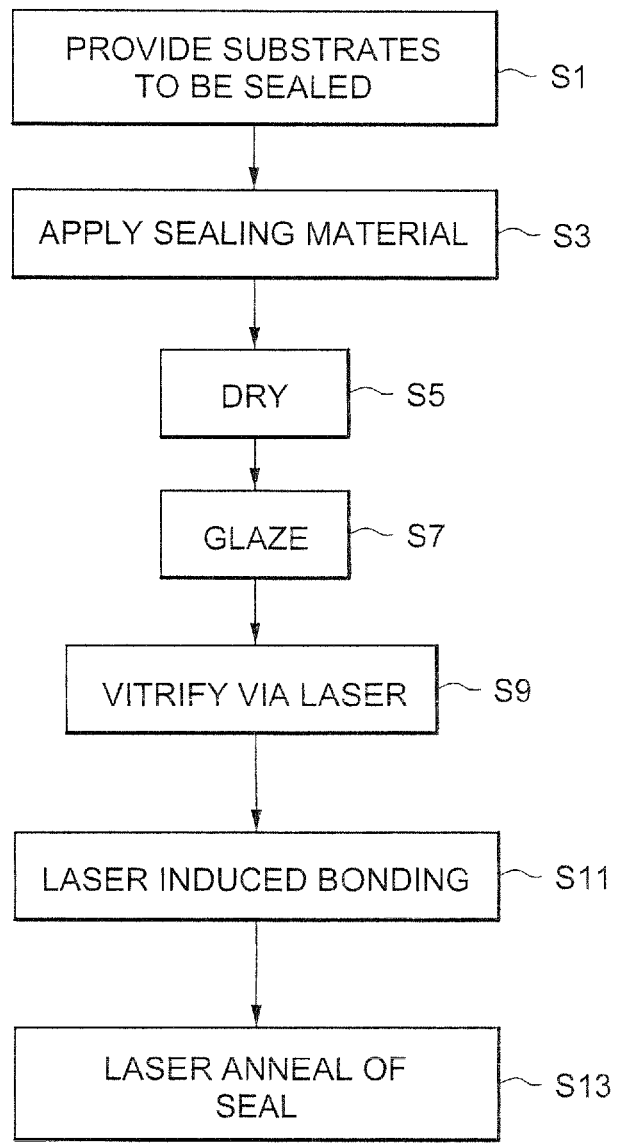
FIG. 8 is a flowchart illustrating a method of sealing substrates using a laser according to certain example embodiments.

FIG. 8 is a flowchart illustrating a method of sealing substrates using a laser according to certain example embodiments, such as, for example, those illustrated in FIGS. 3 and 5 wherein a glass based fit is used to form a seal between glass substrates. According to certain example non-limiting embodiments, the glass substrates to be sealed are provided S1. The substrates may be flat substantially parallel plates, as illustrated for example, with respect to the VIG embodiment illustrated in FIG. 3, or may be a more complex geometric arrangement, such as, for example, the component housing embodiment illustrated in FIG. 5. It will be understood that the example embodiments disclosed herein are equally applicable to any number of conceivable substrate geometries regardless of complexity. Using the example illustrated in FIG. 3 for convenience, the substrates 2, 3 are provided in step S1. The sealing material, such as, for example, and without limitation, a glass based frit, is then applied S3 to areas or regions to be sealed, such as, for example, a peripheral edge of a VIG window unit as illustrated in FIG. 3. The seal material preferably includes an absorbing dye that may be tuned to the characteristics of the laser being used to provide further advantages. The seal material applied to the substrates in step S3 is subsequently dried S5 by, for example, heating at a relatively low temperature, such as, for example, in a range of about 120° C.-150° C., to remove solvents from the vehicle. Following drying S5, the frit is glazed S7 by heating the glass to a higher temperature to glaze the frit and drive out the organic binder material. The fit is then vitrified using laser irradiation S9. During vitirfication S9, the frit heated using a controlled localized laser to its melting point to form, for example, a substantially continuous film made up of the glass network. As noted above, the laser may be applied in a pulsed or continuous manner, and is preferably controlled via a feedback loop based on Ts. Additionally, it is noted that the laser may be applied in air or in an inert atmosphere. The laser and its characteristics are selected such that the laser energy substantially passes through the glass substrate and is substantially absorbed by the seal material, including, for example, and without limitation a seal material that incorporates and absorbing dye. As also noted above, it may be preferable to use a roughing pump or roller to keep the substrates in place during vitrification and subsequent laser induced bonding S11. Additionally, it may also be preferable to provide a heat sink to control lateral heat flow to reduce cracking due to large temperature gradients that may occur in the laser process. After the frit is vitrified, the substrates are bonded S11 under application of laser energy by heating above the glass melting temperature while the substrates are brought together. As discussed above, optional use of a roughing pump or roller to keep the substrates in place and to apply pressure is contemplated. After the bonding process is completed, the completed seal may optionally be annealed by applying laser energy thereto S13. Annealing of the seal reduces stress in the seal and provides a lower probability of failure of the seal by cracking or fracturing. Further, as discussed above, the laser may be applied in any number of different paths, including, but not limited to application of dual laser beams on opposite sides of the article and rastering in opposite directions, application of a single beam rastering in one direction, pulsed application of the laser and/or continuous application of the laser, or the like.

In embodiments using eutectic solders, such as, for example, those illustrated in FIGS. 4 and 6 wherein a metallic solder based sealing material is used to form a seal between glass substrates, the method is similar to that illustrated in FIG. 8. However, in eutectic bonding embodiments, the step of applying the sealing material S3 includes application of an absorber film. The absorber film, according to certain example non-limiting embodiments, comprises a dual layer of silicon rich $SiN_x/Ni$ or $SiN_x/Cr$. The vitrification and bonding steps S9, S11 are accomplished by the laser energy passing through the transparent substrate and being substantially absorbed by the absorber film. The absorber film heats up and melts the eutectic seal material, which then bonds the substrates together as described above.

It is contemplated that any suitable laser may be used to achieve the advantages attendant with the example embodiments disclosed herein. For example, and without limitation, $YVO_4$, Ti:Sapphire, Cu vapor, excimer, Nd:YAG, $CO_2$, ultraviolet, infrared, harmonics of Nd:YAG lasers, or the like, at suitable power levels, spot size and duration, may be used. According to certain example embodiments, a 1090 nm $YVO_4$, an 800 nm Ti:Sapphire or 250 nm (second harmonics) Cu vapor laser, or the like may be used. Moreover, as noted herein, application of the laser energy to the seal material may be in a pulsed or continuous manner. For example, and without limitation, the lasers may be pulsed using, for example, Q-switching using repetitive rates, such as, for example, in a range of about 1 KHz to several hundred KHz, and preferably about 80 KHz. According to certain preferred embodiments, a $YVO_4$ lawer at 30 W average power and pulsing at about 80 KHz focused on the fit area may be preferred. As noted above, according to certain example embodiments, implementation of laser sealing may be accomplished using two laser beams simultaneously focused on opposite sides (e.g., top and bottom) of the glass substrates being sealed together at a scan rate of about 100-150 mm/sec.

It is also noted that laser absorption or heat coupling by the glass substrates may be avoided and/or reduced. According to certain example embodiments, it is preferable to use glass that is substantially transparent to the laser energy being applied so that the glass does not substantially absorb laser energy or couple with the laser to generate heat. For example, laser absorption by glass may occur when using doped (e.g., Fe doped, where there is a significant amount of iron in the glass) glass. Moreover, when glass substrates are exposed to high-intensity beams, non-linear effects may be induced, resulting in disadvantageous laser energy absorption by the glass substrates. Additionally, using cladded glass substrates in which the cladding materials are laser energy absorbing may result in disadvantageous laser energy absorption, and thus undesirable heating of the glass substrates. Accordingly, use of such types of doped and/or cladded glass substrates should be avoided.

Furthermore, surface absorption of laser energy may also occur outside the transparent bands of the laser, such as, for example, and without limitation at <300 nm for an excimer laser and >2 um for $CO_2$ lasers. These outside transparent bands are typically used for surface modification or cutting and should be avoided in laser sealing. Accordingly, according to certain preferred embodiments, lasers having wavelengths in the range of about 200 nm to just below 2000 nm (e.g., wavelengths to which the glass substrates are substantially transparent), are preferred.

It is also noted that tempered glass is strong enough to withstand large temperature variations, such as, for example, in the range of about 200° C. Also, as noted above, it is typically not feasible to process tempered glass using typical bulk heating processes because of the risk of losing temper. Therefore, the laser sealing techniques disclosed herein are particularly well suited to use with tempered glass substrates.

In certain embodiments of this invention, there is provided a vacuum insulated glass (VIG) window unit, comprising: first and second substantially parallel spaced apart substrates comprising glass that are bonded together by an edge seal, said first and second substrates and said edge seal defining a cavity, having a pressure lower than atmospheric pressure; and wherein said edge seal comprises (i) a metallic or substantially metallic layer; and (ii) an absorber film.

In the VIG window unit of the immediately preceding paragraph, said absorber film may be at least partially diffused into said metallic or substantially metallic layer.

In the VIG window unit of any of the preceding two paragraphs, said edge seal may comprise first and second absorber films, said first absorber film being located between the first substrate and the metallic or substantially metallic layer, and the second absorber film being located between the second substrate and the metallic or substantially metallic layer.

In the VIG window unit of any of the preceding three paragraphs, said absorber film(s) may comprise silicon and/or silicon nitride.

In the VIG window unit of any of the preceding four paragraphs, said metallic or substantially metallic layer may comprise or consist essentially of solder.

In the VIG window unit of any of the preceding five paragraphs, said absorber film may including a layer comprising silicon rich silicon nitride characterized by $Si_zN_x$ where z/x is at least 0.78, more preferably at least 0.80.

In the VIG window unit of any of the preceding six paragraphs, said absorber film(s) may comprise a first layer comprising silicon nitride and a second layer comprising Ni and/or Cr. In the absorber film, the layer comprising silicon nitride (which may be doped with Al or the like) is located between the glass substrate and the layer comprising Ni and/or Cr. Thus, for a given absorber film, the layer comprising Ni and/or Cr is located closer to the metallic or substantially metallic layer than is the silicon nitride.

In certain example embodiments of this invention, there is provided a method of making a vacuum insulated glass (VIG) window unit, the method comprising: providing a first substrate; applying a seal material to an area of the first substrate to be sealed; forming a seal by at least (a) vitrifying the seal material using laser irradiation, the laser irradiation exposing the seal material but not being directed toward a majority of the first substrate, and (b) bonding the first substrate to a second substrate by continuing to irradiate the vitrified seal material with laser irradiation to melt the seal material; and evacuating a cavity formed between the first and second substrates and defined by the seal to a pressure lower than atmospheric pressure.

In the method of the immediately preceding paragraph, said first and second substrates may comprise glass.

In the method of any of the preceding two paragraphs, said seal material may comprise a glass based frit. Said glass based frit may include an absorbing dye that absorbs laser energy.

In the method of any of the preceding three paragraphs, the method may include applying pressure to one or both of the substrates during at least the bonding step. The applying of pressure may include pumping out the cavity and/or applying pressure via at least one roller.

In the method of any of the preceding four paragraphs, application of said laser irradiation may be controlled via a feedback loop. The feedback loop may include information regarding a temperature in an area of the laser irradiation.

In the method of any of the preceding five paragraphs, the laser irradiation may be from one or more of an excimer laser, a $CO_2$ laser, an Nd:YAG laser, and a harmonic of an Nd:YAG laser.

In the method of any of the preceding six paragraphs, the laser irradiation may be pulsed and/or continuous.

In the method of any of the preceding seven paragraphs, the laser irradiation may be performed by dual beams directed to opposite sides of the VIG window unit, said dual beams rastering in opposite directions. The beams may raster at a rate in the range of from about 100-150 mm/sec. Alternatively, the laser irradiation may be performed by a single beam rastering in a single direction.

In the method of any of the preceding eight paragraphs, said seal material may comprise a layer comprising metallic or substantially metallic solder. An absorber film may be interposed between the layer comprising solder and at least one of the substrates. Laser energy from said laser irradiation is absorbed by said absorber film that in turn heats and helps melts seal material in the layer comprising solder. The absorber film may comprise one or more of: (i) a layer comprising silicon nitride, (ii) Si-rich silicon nitride characterized by $Si_zN_x$ where z/x is at least 0.78; and (iii) a layer comprising silicon nitride and a layer comprising Ni and/or Cr. For example, in the dual-layer embodiment including a silicon nitride inclusive layer and a layer of or including Ni and/or Cr, the silicon nitride inclusive layer may or may not be Si-rich.

In the method of any of the preceding nine paragraphs, after said bonding, there may be performed annealing the seal by laser irradiation.

In the method of any of the preceding ten paragraphs, application of the laser to the seal material may be performed by the laser passing substantially through the first and/or second substrate and irradiating the seal material, or alternatively application of the laser to the seal material may be performed from a side so that the laser does not pass through either the first or second substrate of the VIG unit to irradiate the seal material.

In the method of any of the preceding eleven paragraphs, the vitrifying and/or bonding steps may be performed (i) in air and/or in an inert atmosphere, and/or (ii) at approximately room temperature.

In the method of any of the preceding twelve paragraphs, the method may further include depositing a metal oxide layer on the first and/or second glass substrate(s) prior to applying said seal material.

In certain example embodiments of this invention, there is provided a method of making an article (e.g., electronic device, VIG unit, or the like) including a sealed cavity formed between substrates, the method comprising: providing first and second substrates comprising glass; applying a sealing material to at least one of the substrates; and forming a seal by irradiating the sealing material with a laser, wherein said cavity is defined by geometries of the substrates and the seal.

In the method of the immediately preceding paragraph, there may also be a step of evacuating the cavity to a pressure lower than atmospheric pressure.

In the method of any of the preceding two paragraphs, a temperature sensitive component may be disposed in said cavity. The temperature sensitive component may be at least one of a semiconductor chip, a sensor, an optical component, organic light emitting layers, and/or an OLED.

In the method of any of the preceding three paragraphs, said seal may be a hermetic seal.

In the method of any of the preceding four paragraphs, said seal material may comprise a glass based frit, or a layer comprising metallic or substantially metallic solder.

In the method of any of the preceding five paragraphs, there may also be a step of annealing the seal via laser irradiation.

In the method of any of the preceding six paragraphs, there may also be a step of providing a thermally conductive heat sink in thermal contact with at least one of the substrates to control lateral heat flow during laser irradiation.

In the method of any of the preceding seven paragraphs, application of said laser irradiation may be controlled via a feedback loop. The feedback loop may (a) include information regarding a temperature in an area of the laser irradiation, and/or (b) be used to control a power and duration of said laser irradiation.

In the method of any of the preceding paragraphs, there may also be a step of providing a thermally conductive heat sink in thermal contact with at least one of the substrates to control lateral heat flow during laser irradiation.

While certain example embodiments have been described and disclosed herein, it will be understood that the embodiments described herein are intended to be illustrative, not limiting, and that those skilled in the art will understand that various modifications may be made without departing from the true spirit and full scope of the claims appended hereto.

What is claimed is:

1. A vacuum insulated glass (VIG) window unit, comprising:
   first and second substantially parallel spaced apart substrates comprising glass that are bonded together by an edge seal, said first and second substrates and said edge seal defining a cavity having a pressure lower than atmospheric pressure;
   wherein said edge seal is located proximate a periphery of the first and second substrates but is not located in a central area of the VIG window unit, and wherein said edge seal comprises (i) a meltable metallic or substantially metallic layer; and (ii) an absorber film; and
   wherein the absorber film comprises both a dielectric layer and a metallic or substantially metallic layer, wherein the dielectric layer directly contacts at least one of the first and second glass substrates.

2. The vacuum insulated glass window unit of claim 1, wherein said absorber film is at least partially diffused into said meltable metallic or substantially metallic layer.

3. The vacuum insulated glass window unit of claim 1, wherein said edge seal comprises first and second absorber films, said first absorber film being located between the first substrate and the meltable metallic or substantially metallic layer, and the second absorber film being located between the second substrate and the meltable metallic or substantially metallic layer,
   wherein each of the first and second absorber films comprises both a dielectric layer and a metallic or substantially metallic layer.

4. The vacuum insulated glass window unit of claim 1, wherein said dielectric layer of the absorber film comprises silicon and/or silicon nitride.

5. The vacuum insulated glass window unit of claim 1, wherein said (i) meltable metallic or substantially metallic layer comprises solder.

6. The vacuum insulated glass window unit of claim 1, wherein said dielectric layer of the absorber film comprises silicon rich silicon nitride characterized by $Si_zN_x$ where z/x is at least 0.78.

7. The vacuum insulated glass window unit of claim 1, wherein said dielectric layer of the absorber film comprises silicon nitride and the metallic or substantially metallic layer of the absorber film comprises Ni and/or Cr.

8. The vacuum insulated glass window unit of claim 1, wherein the metallic or substantially metallic layer of the absorber film comprises Ni and Cr.

9. The vacuum insulated glass window unit of claim 1, wherein the absorber film is configured to heat up and melt the adjacent (i) meltable metallic or substantially metallic film upon incident laser radiation.

* * * * *